United States Patent [19]

Riemer

[11] Patent Number: 5,039,552

[45] Date of Patent: Aug. 13, 1991

[54] METHOD OF MAKING THICK FILM GOLD CONDUCTOR

[75] Inventor: Dietrich E. Riemer, Auburn, Wash.

[73] Assignee: The Boeing Company, Seattle, Wash.

[21] Appl. No.: 587,614

[22] Filed: Sep. 20, 1990

Related U.S. Application Data

[63] Continuation of Ser. No. 860,874, May 8, 1986, abandoned.

[51] Int. Cl.$^5$ ............................................. C23C 24/00
[52] U.S. Cl. .................................. 427/96; 427/126.3; 427/126.5; 427/117
[58] Field of Search ..................... 427/96, 126.3, 126.5, 427/117

[56] References Cited

U.S. PATENT DOCUMENTS

| | | | |
|---|---|---|---|
| 3,681,135 | 8/1972 | Cheary | 117/212 |
| 3,799,890 | 3/1974 | Smith | 252/514 |
| 3,799,891 | 3/1974 | Smith | 252/514 |
| 3,809,797 | 5/1974 | McMunn, III et al. | 174/52 |
| 4,032,350 | 6/1977 | Greenstein | 252/514 |
| 4,040,822 | 8/1977 | Stern | 420/542 |
| 4,119,262 | 10/1978 | Yen | 228/223 |
| 4,278,725 | 7/1981 | Riley et al. | 428/208 |
| 4,416,932 | 11/1983 | Nair | 427/126.5 |
| 4,418,099 | 11/1983 | Cuevas | 106/1.26 |

OTHER PUBLICATIONS

Dietrich E. Riemer "Thick Film Conductors Without Glass or Oxide Binders for Improved Wire Bonding in Multilayer Circuits" ISHM Proc. 1979, pp. 143-147.

Dietrich E. Riemer, "High-Adhesion Thick-Film Gold Without Glass or Metal-Oxide Powder Additives", IEEE Transactions on Components, Hybrids, and Manufacturing Technology, vol. CHMT-8, No. 4, Dec. 1985.

Primary Examiner—Shrive Beck
Assistant Examiner—Vi Duong Dang
Attorney, Agent, or Firm—Christensen, O'Connor, Johnson & Kindness

[57] ABSTRACT

An improved method for producing a gold conductor on a substrate in the manufacture of a thick film hybrid circuit, such that the gold conductor is suitable for wire bonding. The method comprises screen printing a fluxless gold paste on the substrate, and then firing the substrate and paste. The paste includes the resinate of a metal that can form an alloy with gold and that can also form an oxide at the firing temperature. Suitable gold pastes include bismuth and cadmium resinates in a total amount by weight of less than 1%.

7 Claims, No Drawings

METHOD OF MAKING THICK FILM GOLD CONDUCTOR

This application is a continuation application based on prior copending application Ser. No. 06/860,874, filed on May 8, 1986, now abandoned.

FIELD OF THE INVENTION

The present invention relates to screen printing for thick film, hybrid electrical circuits, and in particular to an improved method for producing a thick film gold conductor on a substrate.

BACKGROUND OF THE INVENTION

Screen printing is older than the electronic industry, and was initially developed in the first decade of this century out of the even older art of printing with stencils. In a modern screen printing process, a stainless steel screen is positioned on a ceramic or glass substrate, the screen having portions masked such that unmasked areas represent the areas to be printed. A printing ink containing a metal powder is then placed on the screen, and a squeegee is drawn over the screen to force the ink through the unmasked areas of the screen. The screen is then withdrawn, and the ink coated substrate is fired, leaving a pattern of metal conductors on the substrate.

The use of gold for thick film circuit fabrication has resulted in a significant advance in microelectronics. Gold is the most malleable and ductile of all metals, properties that assist in drawing fine wire and in wire bonding. Furthermore, gold does not directly combine with oxygen under any conditions. The absence of an oxygen reaction allows air firing of gold at temperatures up to its melting point. However a well known problem with the use of gold for printing inks for thick film conductors is that it is difficult to obtain adhesion between the gold and underlying substrate. In particular, while the lack of an oxide layer on the surface of gold is advantageous when forming a bond with a metal, such as in wire bonding, it is not advantageous for adhesive bonds with metal oxides such as glasses or ceramics.

Adhesion may be defined as the binding force exerted by molecules of unlike substances when brought into contact. Molecular level adhesion is a surface phenomenon, because only the surface molecules of the two bonded materials interact. The strongest molecular-level bond is the shared electron bond in which adjacent atoms share orbital electrons. For a shared electron bond to become effective, the atoms must come so close to each other that their electron shells overlap. Metals and metal alloys typically form shared electron bonds between atoms.

Electrostatic bonding is responsible for a different kind of adhesion mechanism. An electrostatic bond is based on electrostatic forces between molecules having electric poles, i.e., ions or dipoles. The molecules, when in close contact, will try to orient themselves so that the poles of opposite polarity attract one another. Such orientation is possible only if the molecules can move within their crystal structure. Electrostatic bonding, therefore, typically requires heating of materials to their softening points.

Oxides are electrically polarized, because of the shift of electrons during formation of the oxide molecule. Glasses, ceramics and other oxygen containing substrates upon which gold is deposited adhere to other substances through electrostatic bonds. Because gold has no affinity for oxygen, gold forms only shared electron bonds. A direct molecular bond of gold to substrate is therefore impossible, because the bonding mechanisms of the two materials are incompatible. Depositing gold directly on glass or ceramic results in a film without adhesion. This problem is overcome in thin film technology by the vacuum deposition of intermediate materials, such as chromium, on the glass before the gold is deposited.

The first generation of thick film gold inks obtained adhesion of gold to the substrate by the addition of glass frits to the gold powder. When a printing ink containing a glass frit is used, the glass melts during firing, flows between the gold particles under the influence of gravity and capillary action to the interface between the printed gold film and the substrate, and subsequently solidifies upon cooling. The glass wets the substrate and surrounds the gold particles, mechanically locking the gold film to the substrate. Particle size distribution of the gold powder significantly affects adhesive strength, because the gold film must be porous for mechanical interlocking by glass. High-density gold films therefore cannot be used in the frit bonding system.

Problems with frit bonded gold inks include low adhesive strength due to the low tensile strength of glass, the formation of glass coatings on the gold film that interfere with wire bonding, high sensitivity to firing parameters, and adhesion that varies with print thickness. In the past, in many circumstances, the top gold conductor of a multi-layer structure was overprinted with a fritless gold conductor, in order to cover any glass film with a clean gold bonding surface to obtain improved wire bonding characteristics.

About 15 years ago, a reactive bonding system was introduced, as exemplified by U.S. Pat. Nos. 3,799,890 and 3,799,891. The reactive bonding system is based upon the use of a copper oxide and/or cadmium oxide additive in powder form, and upon certain critical firing parameters. A disadvantage of the reactive bonding technique is that the fired gold film is coated with a relatively thick layer of copper oxide, making wire bonding extremely difficult. Another disadvantage is the comparatively high firing temperature necessary for bonding by the reactive bonding technique.

In general, the best prior approach to thick film fabrication has been to combine glass frits and reactive bonding agents as powders in the gold ink. A glass frit is added to carry the reactive copper oxide to the interface of the gold and substrate, and to serve as a filler for the gaps between the relatively rough gold film and the relatively flat substrate surface. The glass also increases the area of mechanical contact with the underside of the gold conductors, allowing the use of lower concentrations of bonding additives in the ink, resulting in less gold film surface contamination. Nevertheless, mixed-bonded inks still have the problems of surface contamination by glass and reactive bonding agents. These inks must also possess some porosity to allow the flow of molten glass to the gold/substrate interface, resulting in a softness undesirable in wire bonding. Even after the introduction of mixed bonded gold inks, many thick film fabricators continued to use an overprint step using a fluxless gold ink for the top conductor of multi-layer structures, to achieve maximum wire bondability.

SUMMARY OF THE INVENTION

The present invention provides an improvement in the process of manufacturing a thick film hybrid circuit. In particular, the present invention provides an improved method of producing a gold conductor on a substrate such that the resulting gold conductor is suitable for wire bonding. The improved method comprises screen printing a fluxless gold paste on the substrate, and then firing or heating the substrate and the paste printed thereon. The term "fluxless" means that the paste does not contain a glass frit or a reactive bonding agent. The paste does include a carrier liquid containing disbursed gold particles, and the resinate of a base metal that can form an alloy with gold and that can also form an oxide. The term "base metal" designates a metal other than gold, silver or platinum. The substrate and paste are fired at a temperature that is sufficient to decompose the resinate and obtain nascent base metal, and to convert some of the metal to its oxide. In a preferred embodiment, the resinate comprises bismuth and cadmium resinates, and the total amount of resinate in the paste by weight is less than 1%.

DETAILED DESCRIPTION OF THE INVENTION

The present invention is based upon the discovery that certain commercially available fluxless gold pastes can be used in a screen printing process to produce an essentially pure gold conductor directly adhering to a ceramic or glass substrate. Examples of such gold pastes are product No. A-4650 available from Englehard Industries, as well as the gold pastes described in U.S. Pat. No. 3,809,797. Such pastes contain gold powder and an organic carrier, but do not contain glass frits, copper oxide, or other conventional additives to promote binding to a substrate. In the past, such gold pastes have been used to produce the top layers of multilayer circuits, and for the packaging of integrated circuits. In the former application, the gold paste is deposited on the surface of an existing gold layer. Because the gold paste does not contain a glass frit or metal oxide additive, it forms a clean, gold bonding surface that can be used for wire bonding. Because the gold paste is used on top of an existing gold layer, rather than directly on a substrate, the lack of a glass frit or metal oxide does not cause adhesion problems. The use of gold pastes to package integrated circuits is described in the above-referenced U.S. Pat. No. 3,809,797.

The discovery that gold pastes can be used to create gold conductors on dielectric substrates came about during a test of a gold paste equivalent to the material now available from Engelhard Corporation under the product designation A-4650. The original purpose of the test was to demonstrate that the paste was in fact fluxless, i.e., that the paste would not adhere to a dielectric. The result of the test was that a very high level of adhesion was found. Analysis revealed that such adhesion resulted from extremely thin layers of metal and metal oxides and, in particular, bismuth and cadmium and their oxides, on the surface of the gold. The bismuth and cadmium derived from very small quantities of bismuth and cadmium resinates in the original gold paste. It appears that metal resinates were added to the gold paste by the manufacturer as sintering agents to produce a denser gold film.

The amount of resinate by weight in the paste is preferably less than 1%. For the particular A-4650 paste available from Engelhard, the amount of resinate by weight appears to be approximately 0.5%, with the ratio of cadmium to bismuth being about 2:1 by weight. It appears that the A-4650 paste presently available from Engelhard is close to optimum for producing strong bonds to substrates while also producing essentially clean surfaces for wire bonding. When such resinates are heated to temperatures above about 350° C., the organic material separates from the metal and is evaporated or burned. The metal is then available in the very reactive nascent state. Because bismuth, cadmium and many of the alloys of these metals are liquid at 350° C., it appears that the gold is flash coated with the metals just before they oxidize. The result is that bismuth, cadmium and their oxides are deposited on the gold particles, as very thin layers having thicknesses on the order of 10–15 Angstroms, i.e., about 3 molecules thick. In such layers, the bismuth, cadmium or other metal atoms can form shared electron bonds with the gold, while the metal oxides in the layer can form electrostatic bonds with the glass or ceramic substrate. As a result, the bonding incompatibility between gold and the dielectric substrate is resolved in an extremely efficient and economical way. In addition, and of great significance to the technology for producing thick film hybrid circuits, the gold conductors produced by means of the fluxless gold paste result in clean fired gold surfaces similar to those of pure gold, with outstanding wire bonding characteristics.

An additional attraction of the process of the present invention is that the paste or ink manufacturing process is simplified. The simplification arises because powdered additives, such as glass frits and copper oxide, require careful wetting in milling operations. By contrast, the metal resinates required for the present invention are available in liquid forms. Furthermore, the result of the dispersion of the metal resinates at the molecular level is that efficient use can be made of the metal resinate material, and extremely small quantities of the resinates (i.e., less than 1%) are sufficient to provide the required bonding. This in turn means that the resulting gold conductor is essentially pure gold, and possesses excellent wire bonding characteristics.

The characteristics of gold conductors deposited on dielectric substrates are summarized in Table 1.

|  |  | A-4650 Gold Paste | | DP 4019 Gold Ink (mixed bonded) | | DP 9260 Gold Ink (frit bonded) | |
| --- | --- | --- | --- | --- | --- | --- | --- |
| Thickness | | 9 microns | | 8 microns | | 12 microns | |
| Number of firing cycles | | 1 | 10 | 1 | 10 | 1 | 10 |
| Dielectric | DP 5704 (filled glass) | 4.2 | 4.0* | 2.0 | 2.2* | 1.5* | 1.1* |
| | DP 9429 (crystalizing) | 2.2 | 3.3 | 2.4 | 2.8 | 2.2* | 2.8* |
| | 96% alumina | 3.0 | 4.1 | 2.2 | 3.0 | 2.5 | 1.6 |

This table shows the adhesion achieved with Engelhard A-4650 gold paste after one and ten firings, each firing being at a peak temperature of 875° C. with a 20-minute total firing time. The peak temperature was selected to be sufficient to soften the dielectric. The table shows the minimum peel strength, in pounds, of solder joints on 0.08 by 0.08 inch gold pads, using a 50/50 Pb/In solder. An asterisk next to a peel strength value signifies that separation occurred completely in the solder above the gold pad. The adhesion is shown for three different dielectrics: 5704, a filled glass dielectric available from DuPont; 9429, a crystalizing dielectric available from DuPont, and a 96% alumina dielectric. For comparison purposes, the A-4650 gold paste is compared with two conventional gold inks, a mixed bonded ink available from DuPont under product No. 4019, and a frit bonded gold ink available from DuPont under product No. 9260.

Table 1 demonstrates that the bond between the gold conductor created by means of the present invention is very strong, particularly on a filled glass dielectric, i.e., a glass filled with alumina for controlling viscosity during firing. Such dielectrics apparently soften sufficiently during firing to allow the gold to sink in and make surface contact with the glass. Crystallizing dielectrics and alumina do not soften, and these dielectrics therefore make contact with the underside of the gold only at the protruding points, resulting in lower adhesion. The gold conductors fabricated according to the present invention show little change in adhesion as a function of printing thickness or number of firings. The result of wire bonding tests on the gold conductors fabricated using the A-4650 gold paste were identical to those achieved using a pure gold paste not containing resinates as gold overprint on conventional fluxed gold. The thin layer of metal and metal oxide on the fired gold film breaks easily when the gold is deformed by pressure of wiring bonding.

While the preferred embodiments of the invention have been illustrated and described, it should be understood that variations will be apparent to those skilled in the art. Accordingly, the invention is not to be limited to the specific embodiments illustrated and described, and the true scope and spirit of the invention are to be determined by reference to the following claims.

The embodiments of the invention in which an exclusive property or privilege is claimed are defined as follows:

1. In the process for manufacturing a thick-film hybrid circuit, an improved method of producing a gold conductor on a substrate, such that the gold conductor is suitable for wire bonding, the improved method comprising:
    screen printing a fluxless gold paste on the substrate, the paste comprising a carrier liquid containing dispersed gold particles and the resinate of a base metal that can form an alloy with gold and that can form an oxide, wherein the resinate comprises a cadmium resinate; and,
    heating the substrate and the paste printed thereon to a temperature sufficient to decompose the resinate and obtain nascent base metal, and to convert some of the metal to its oxide.

2. In the process for manufacturing a thick-film hybrid circuit, an improved method of producing a gold conductor on a substrate, such that the gold conductor is suitable for wire bonding, the improved method comprising:
    screen printing a fluxless gold paste on the substrate, the paste comprising a carrier liquid containing dispersed gold particles and the resinate of a base metal that can form an alloy with gold and that can form an oxide, wherein the resinate comprises a bismuth resinate and a cadmium resinate; and,
    heating the substrate and the paste printed thereon to a temperature sufficient to decompose the resinate and obtain nascent base metal, and to convert some of the metal to its oxide.

3. In the process for manufacturing a thick-film hybrid circuit, an improved method of producing a gold conductor on a substrate, such that the gold conductor is suitable for wire bonding, the improved method comprising:
    screen printing a fluxless gold paste on the substrate, the paste comprising a carrier liquid containing dispersed gold particles and the resinate of a base metal that can form an alloy with gold and that can form an oxide, wherein the resinate comprises bismuth and cadmium resinates in a ratio of about 2 to 1 by weight; and,
    heating the substrate and the paste printed thereon to a temperature sufficient to decompose the resinate and obtain nascent base metal, and to convert some of the metal to its oxide.

4. The method of claim 1, 2, or 3 wherein the resinate comprises less than 1% by weight of the paste.

5. The method of claim 4, wherein the resinate comprises about 0.5% by weight of the paste.

6. The method of claims 1, 2, or 3, wherein the substrate is composed of a dielectric material that softens at said temperature.

7. The method of claims 1, 2, or 3, wherein the substrate comprises a glass filled with alumina.

* * * * *